US009462669B2

(12) United States Patent
Prater

(10) Patent No.: US 9,462,669 B2
(45) Date of Patent: Oct. 4, 2016

(54) PLASMA CONFINEMENT DEVICE

(71) Applicant: Daniel Prater, Noblesville, IN (US)

(72) Inventor: Daniel Prater, Noblesville, IN (US)

( * ) Notice: Subject to any disclaimer, the term of this patent is extended or adjusted under 35 U.S.C. 154(b) by 3 days.

(21) Appl. No.: 14/879,929

(22) Filed: Oct. 9, 2015

(65) Prior Publication Data

US 2016/0037617 A1 Feb. 4, 2016

Related U.S. Application Data

(63) Continuation-in-part of application No. 14/505,864, filed on Oct. 3, 2014, now abandoned.

(60) Provisional application No. 61/886,470, filed on Oct. 3, 2013, provisional application No. 61/986,263, filed on Apr. 30, 2014, provisional application No. 62/027,882, filed on Jul. 23, 2014.

(51) Int. Cl.

| | |
|---|---|
| ***H05H 1/02*** | (2006.01) |
| ***H05H 1/11*** | (2006.01) |
| ***H01J 37/32*** | (2006.01) |
| ***H05H 1/16*** | (2006.01) |

(52) U.S. Cl.
CPC .. *H05H 1/11* (2013.01); *H05H 1/16* (2013.01)

(58) Field of Classification Search
None
See application file for complete search history.

(56) References Cited

U.S. PATENT DOCUMENTS

| | | | | |
|---|---|---|---|---|
| 3,141,826 A | 7/1964 | Friedrichs et al. | | |
| 3,230,418 A * | 1/1966 | Kerr | H05H 1/11 313/161 | |
| 3,005,767 A | 10/1967 | Boyer et al. | | |
| 3,369,140 A | 2/1968 | Furth | | |
| 6,297,595 B1 * | 10/2001 | Stimson | H01J 37/321 315/111.21 | |

OTHER PUBLICATIONS

Collins, C., "Spinning an Unmagnetized Plasma for Magnetorotational Instability Studies in the Plasma Couette Experiment", PhD Thesis, University of Wisconsin-Madison, (2013). Specifically Fig. 3.1 p. 47 and Section 3.2-3.2.1 p. 48-49 for using a static electric field and toroidally-localized (single, non-continuous) electrodes.

Collins, C., et al, "Stirring Unmagnetized Plasma", Physical Review Letters, v. 108, 115001, Mar. 16, 2012. Specifically Figure 1 and paragraph spanning p. 115001-2 to 115001-3; repeat of information of Cite No. 1.

Dolan, T.J., "Magnetic Electrostatic Plasma Confinement." Plasma Physics and Controlled Fusion 36 (1994), pp. 1539-1593. Specifically Figure 8 and Section 3.5 for a linear set of ring cusps ("line cusp").

Berkowitz, J., et al. "Cusped geometries." Journal of Nuclear Energy (1954) 7.3 (1958): 292-293. Specifically Figures 4, 5, and 6 (specifically 6b) showing crossed B fields, crossed E and B fields, and a "line" cusp, respectively.

(Continued)

*Primary Examiner* — Dedei K Hammond
(74) *Attorney, Agent, or Firm* — Bruce J. Bowman

(57) ABSTRACT

A device and method for the magnetic confinement of plasma is formed by a cylindrically stacked column of current-carrying magnetic field coils with electrodes interior to each magnetic field coil so as to induce plasma fluid rotation about an annular confinement region formed of cusped-geometry magnetic fields. Electrodes are formed such that the electric fields produced are tangential to the magnetic fields, and so as to maintain consistent azimuthal direction of plasma rotation, electric field electrodes alternate accordingly in polarity along the axial length of the device.

21 Claims, 7 Drawing Sheets

(56) References Cited

OTHER PUBLICATIONS

Post, R. F. "Symposium on new trends in unconventional approaches to magnetic fusion"; Stockholm (Sweden); Jun. 16-18, 1982; (Apr. 5, 1983) 24 p; UCRL-89018; CONF-830623-1; Available from NTIS, PC A02/MF A01 as DE83010064. Ref. No. 14785042. Specifically p. 14, 1st-4th paragraphs for multipole cusp with no electric field.

Ellis, R. F., et al. "Steady supersonically rotating plasmas in the Maryland Centrifugal Experimenta)." Physics of Plasmas (2005): 055704. Specifically Figures 1 and 2 showing a rotating plasma device.

Hassam, A. B. "Stability of magnetohydrodynamic Dean Flow as applied to centrifugally confined plasmas." Physics of Plasmas (1999): 3738-3743. Specifically Figure 1 showing the geometry of a rotating plasma.

Lehnert, B. "Rotating plasmas." Nuclear Fusion 11.5 (1971): 485. Specifically Figure 1, p. 490 for a diagram of a rotating plasma device, and Section 3.1, p. 515 for an account of rotating plasma devices.

Carden, P. O. "An historical review of the development of high-field electromagnets, particularly with regard to the theory of mechanical strength and the limits of performance." Reports on Progress in Physics 39.11 (1976): 1017. Specifically Figures 6, p. 1031 and 7, p. 1033 for a historical account of Bitter plate electromagnet design.

Hershkowitz, N., Dawson, J.M., "Fusion Reactor with Picket-Fence Walls", Nuclear Fusion, vol. 16, No. 6, p. 639-1976. Specifically the first two paragraphs and Figure 1.

Haines, M.G., "Plasma Containment in Cusp-Shaped Magnetic Fields", Nuclear Fusion, vol. 17, No. 4, 1977. Specifically Section 7.1, Multiple Line Cusps.

* cited by examiner

PLASMA CONFINEMENT DEVICE

CROSS-REFERENCE TO RELATED APPLICATIONS

This non-provisional patent application is a continuation-in-part of U.S. Non-provisional patent application Ser. No. 14/505,864 filed Oct. 3, 2014 titled "Plasma Confinement Device" that claimed the benefit of and/or priority under 35 U.S.C. Section 119 to U.S. Provisional Patent Application Ser. No. 61/886,470 filed Oct. 3, 2013, titled "Plasma Containment Device", U.S. Provisional Patent Application Ser. No. 61/986,263 filed Apr. 30, 2014, titled "Coaxial Mirror Confinement of Plasma", and U.S. Provisional Patent Application Ser. No. 62/027,882, titled "Device For Plasma Containment", the entire contents of each one of which is specifically incorporated herein by this reference.

FIELD OF THE INVENTION

The present invention relates in general to the subjects of ionized gas (plasma) confinement and devices for plasma confinement, and specifically, to devices and methods for plasma confinement in cusped magnetic fields with plasma rotation established by interaction of plasma with electric fields intersecting cusped magnetic fields.

BACKGROUND OF THE INVENTION

In general the leading approaches to magnetic confinement of plasma include closed systems (tori), open systems (magnetic mirrors), and pinches. In closed systems, the magnetic field lines (imaginary lines indicating the direction of a magnetic field at a location in space, the density of lines representing the magnitude of the magnetic field at that location; also called "lines of force") are confined within the system, even if they do not close upon themselves; stellarators, multipoles, and tokomak reactors are examples. Open systems such as magnetic mirror machines and cusped magnetic field machines retain plasma through charged particle reflection along field lines; the 2XII magnetic mirror device developed at Lawrence Livermore National Laboratory is one example. Pinch systems, which include theta- and z-pinches (where theta and z indicate their typical cylindrical coordinate directions), confine and heat plasma by the magnetic field generated by a large plasma current; examples include theta pinch machines at Los Alamos National Laboratory and Culham Laboratory. Many variations of open and closed systems have been constructed including Astron, an open toroidal device employing a relativistic electron beam and magnetic mirrors, reversed-field configuration (RFC) devices, and others. Presently, most of the experimental investigation is on the physics of RFCs, stellerators, and tokamaks but many other confinement strategies have been envisioned and developed (see References below, Chen, 1st Ed., Ch. 9).

The primary challenge of magnetic plasma confinement is stability (Chen 1st Ed. Ch. 9). In order for plasma to be stably confined in a magnetic field it must be confined from outward diffusion by convex magnetic field lines as viewed from the plasma interior. Edward Teller in October 1954 suggested this criterion due to possible formation of "interchange" instabilities where concave magnetic field lines and plasma rapidly exchange position (see References below, Bishop). The interchange instability, and many other plasma instabilities, have since been verified experimentally and are well known to those skilled in the art (see References below, Bateman).

Despite the many unstable configurations for plasma confinement there does exist a large family of absolutely stable configurations bounded by cusped surfaces (see References below, Berkowitz 1958; Grad 1961). A cusp is a geometric term indicating a pointed end where to two curves meet, and in the practice of plasma confinement, cusp configuration magnetic fields converge between fields of reversing polarity. At these regions of convergence, plasma charged particles may either be reflected in a process analogous to magnetic mirror charged particle reflection, or lost as they travel along field lines through the cusp. Cusp reactors describe a spectrum of device configurations. Examples includes the Versatile Toroidal Facility experimental device at Massachusetts Institute of Technology, Polywell systems such as the experimental reactor presently under investigation at Energy Matter Conversion Corporation (EMC2) (see References below, Park, et al.), "picket-fence" systems (see References below, Hershkowitz and Dawson 1976), U.S. Pat. No. 2,961,559 to Marshall, U.S. Pat. No. 3,141,826 to Friedrichs and Grad, and others. Plasma processing devices for use in the semiconductor industry also use cusp-field devices for example U.S. Pat. No. 7,692,139 B2 to Koo.

Herein, reactors and devices that generate cusped magnetic fields are generally referred to as "cusped-field devices", "cusp reactors", & etc.

While cusped-field configuration reactors are the only known class of confinement schemes known to be absolutely magnetohydrodynamically (MHD) stable, these reactors have demonstrated significant particle losses through the cusp, described by those with skill in the art by a "hole size" (see References below, Haines), a linear dimensional measurement that may apply to line, ring, and point cusps. In part cusp losses are due to a "null point" of zero magnetic field where collisions between charged particles impart a velocity along magnetic field lines such that plasma is lost through the cusp (see References below, Berkowitz 1959). The cusp hole size has been measured to be on the order of the ion gyroradius (see References below, Allen 1965, Pechacek 1980), too large for commercial utility. In the present invention azimuthal fluid rotation forces plasma away from the confinement field null point, thus significantly modifying the physics of particle losses through the cusp.

Cusped magnetic fields demonstrate particle reflections along magnetic field lines approaching the cusp similar in physical nature to magnetic mirror particle reflection. Early theoretical work, however, assumed plasma charged particles traversed between adiabatic regions near the cusp and non-adiabatic regions away from the cusp such that adiabatic invariance common to magnetic mirror analysis did not apply (see References below, Grad 1957). The present invention possesses an adiabatic plasma sheath (see below) but whether a non-adiabatic region is necessary for particle reflection analysis is to be determined.

While cusped magnetic field charged particle reflection is similar in nature to magnetic mirror charged particle reflection, cusp losses are unique. The magnitude of the magnetic field of prior art cusp reactors does not always increase for a particle approaching a cusp (see References below, Grad 1957, and Friedrichs et. al U.S. Pat. No. 3,141,826). This gives some distinction between cusp reactors in general and the present invention that has an increasing confinement field approaching the cusp. More importantly, however, prior art cusp reactors invariably permit plasma to occupy the null point. In this region of non-adiabatic processes, particle magnetic moments are randomized, and particles accepting momentum along magnetic field lines are lost through the cusp. Attempts at "particle trapping" have not proven experimentally successful (see References below, Tuck 1959 and Grad 1960).

In cusp reactors an adiabatic plasma sheath separates field-free plasma from the vacuum magnetic field. The plasma sheath is where mirror-type particle reflections and charged particle drifts resulting in both fluid flow and current generation occur (see References below, Haines). The present invention departs from prior art cusp systems by generating a plasma fluid rotation driven by electrodes shaped to produce an electric field everywhere perpendicular to, or nearly perpendicular to, the confining magnetic field. Sheath and field-free plasma between ring cusps is thereby driven to rotate, significantly modifying the physics of prior art cusp systems (see References below, Spalding).

Additional plasma confinement reactors include U.S. Pat. No. 3,369,140 to H. P. Furth describing the annular confinement of high temperature plasmas between coaxial solenoidal field coils. This design, and others, departs from the present invention on a number of grounds. The design to Furth, and the design of U.S. Pat. No. 3,189,523 to Patrick, fail to stably confine plasma, are unable to achieve a sufficient magnetic mirror ratio, possess a concave magnetic field curvature (a shortcoming of the rotating plasma device IXION of U.S. Pat. No. 3,005,767 to Boyer and the Homopolar generator of Anderson; see References below, Anderson 1959), or are rotating shaft devices (for instance U.S. Pat. No. 4,710,660 to McKee), or in general are not cusp reactors.

To overcome the limitations of prior art cusp-field plasma confinement, the present invention introduces electrodes to drive plasma fluid rotation about the device axis, claiming the benefits of induced plasma currents.

SUMMARY OF THE INVENTION

Techniques and device configurations for the confinement of a rotating plasma in cusped magnetic fields are disclosed.

In one form, the magnetic fields are formed by at least three current-carrying magnetic field coils held in proximity along a shared cylindrical axis, each coil producing a magnetic field B opposite in polarity in relation to its neighboring coil to create a cylindrical column of any number of cusped-geometry magnetic fields interior to the magnetic field coils.

In one form, the field coils surround a vacuum vessel that may be continuous at the cusp or closed at the cusp.

In one form, electrodes are positioned within the vacuum vessel. In accordance with this particular embodiment the electrodes alternate in polarity along the axial length of the device and are positioned and shaped such that the electric fields and magnetic fields intersect to generate an azimuthal plasma fluid drift about the device axis.

In one form, not less than the following is accomplished. Plasma is confined in cusped magnetic fields and centrifugally rotated by E×B drift. In accordance with this form the convex shape of the cusped field ensures plasma stability and confinement of plasma along magnetic field lines is ensured by charged particle reflection at the cusps by the magnetic mirror effect, this longitudinal confinement being aided by the repelling forces of adjacent plasma currents. Still in accordance with this form, charged particles diffusing outwardly are retained against an outwardly increasing magnetic pressure and inwardly charged particles are drawn to the plasma sheath by the centrifugal force of plasma centrifugal rotation and viscosity. Still further in accordance with this form, momentum is transferred to plasma along the Poynting vector in the same direction as plasma fluid flow.

It should be well appreciated that various details of the present invention may be changed without departing from the spirit and scope of the invention. Furthermore, the foregoing description is for illustration only, and not for the purpose of limitation, the invention being defined by the claims.

BRIEF DESCRIPTION OF DRAWINGS

The mentioned and other features and objects of this invention, and the manner of attaining them, will become more apparent and the invention itself will be better understood by reference to the following description of forms of the invention taken in conjunction with the accompanying drawings.

FIG. 5 shows an exterior view of the vacuum vessel 106, placement of magnetic field coils 100 in relation to the vacuum vessel 106 and a partial cutaway showing the interior of the vacuum vessel 106 to indicate relative location of electrodes 103.

It should be appreciated that not all of the features of the components of the figures are necessarily described. Some of these non-discussed features as well as discussed features are inherent from the figures. Other non-discussed features may be inherent in component geometry and/or configuration.

DETAILED DESCRIPTION

Figure 1:
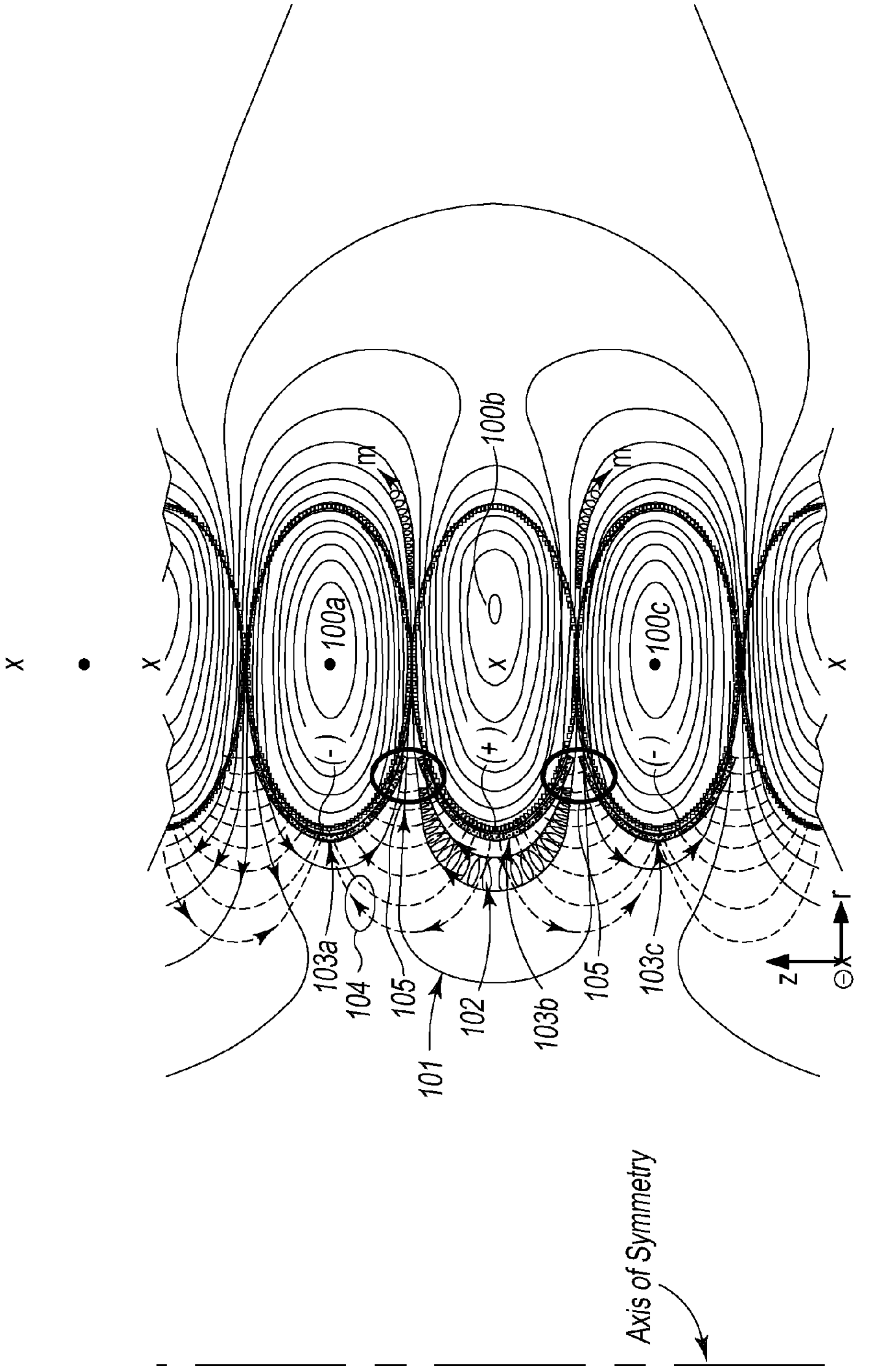
FIG. 1 is a cylindrical cutaway view along the cylindrical axis of a form of the device showing three magnetic field coils 100*a*, 100*b*, 100*c* and two partial field coils of N number of field coils. As indicated using common indication convention (i.e., into page, x, out of page, dot), adjacent coils are energized with currents opposing in direction along the axial length to produce opposing magnetic fields with magnetic field line 101 directions as indicated by arrows following convention. The approximate location and shape of plasma 102, and approximate location and shape of electrodes 103*a*, 103*b*, 103*c*, and etc. are indicated with electrode polarities alternating as indicated (+) and (−) producing electric fields with electric field lines 104 at approximate right angles to magnetic field lines 101. Regions where charged particles are reflected, or continue along magnetic field lines to be lost (mass m), occur in regions of the cusp 105. Also indicated is a coordinate axis showing for reference axial direction z, radial direction r, and azimuthal direction theta. Bold text within this description indicates values and features with directionality, such as vectors and tensors.

Referring now to FIG. 1, to create a cusped-geometry magnetic field for plasma confinement, magnetic confinement field coils 100 ("field coil" & etc.) of equal major radius are placed along a shared cylindrical axis in adequate proximity and energized such that adjacent magnetic fields oppose, exert a repelling Ampère force upon adjacent field coils 100, and generate cusps in the magnetic field in regions of space 105 ("the cusp" & etc.) for plasma 102 charged particle reflection or loss along magnetic field lines 101. In cylindrical coordinates the reactor may be of any length along the z-axis and of any radius and composed of any number of coils 100. In general the number of magnetic field coils 100 and electrodes 103 is N, the number of cusps 105 between magnetic fields therefore created is N−1, the number of confined plasmas 102 is N−2, and preferentially N is an odd number equal to or greater than 5. Plasma 102, illustrated to occupy the confinement region interior to magnetic confinement field coil 100*b*, may occupy any confinement region interior to any field coil 100 at any position along the axial length of the device. Plasma 102 is made up of charged particles (ionized gas) confined to helical paths along magnetic field lines 101 and etc. as is known to those with skill in the art. Plasma 102 may refer to individual plasma 102 as illustrated in FIG. 1 or to multiple plasmas adjacent to one another along the device axis. Individual plasma 102 is located radially interior to a field coil 100 and each plasma 102 may be semi-continuous in the axial direction through charged particle exchange by diffusion or by transfer at the cusp 105. Plasma 102 also may refer to sheath plasma ("sheath" and etc.) or alternately sheath plus field-free plasma occupying any space from sheath plasma to any position radially interior of the sheath plasma where sheath plasma is defined as the mass of plasma charged particles adjacent to the vacuum magnetic field and under the influence that field and/or the electric field applied by the electrodes 103.

Interior to the magnetic field coils 100 and etc. is a vacuum vessel (see FIG. 4) within which is plasma 102 and electrodes 103. This vacuum vessel 106 can be made of steel, aluminum, or any of the materials commonly used for plasma confinement vessels. In transverse section at the equatorial plane of a field coil 100 the vacuum region may be generally circular. In transverse section at the region of the cusp 105, generally between magnetic field coils 100, the vacuum vessel 106 may be closed to particle loss through the cusp 105, whereon charged particles being lost through the cusp 105 will impinge upon loss window 107, composed of any suitable material for example a ceramic or quartz, or the vacuum vessel 106 may be open through the cusp 105 and continuous into a region of electrostatic deceleration electrodes known to those with skill in the art (see References below, Chen 1st Ed., Ch. 9, and Miley 1976).

Figure 2:
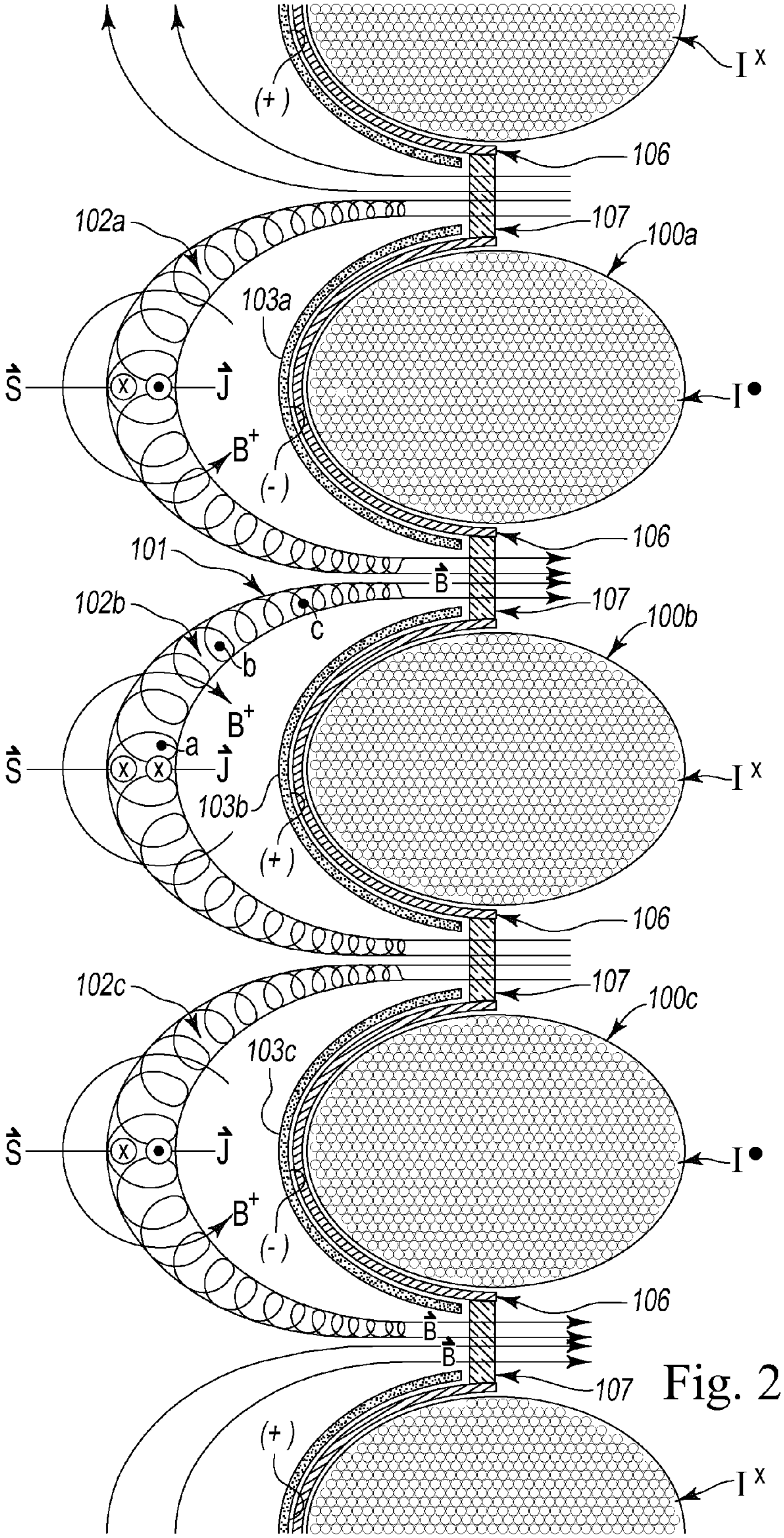
FIG. 2 depicts a similar cylindrical cutaway view device configuration with various features extended in proportion for clarity showing magnetic field coils 100*a-c* with currents I into (x) or out of (dot) the page, magnetic field lines 101, plasma 102*a-c* (indicated separately to distinguish various features), electrodes 103*a-c*, vacuum vessel 106, and loss windows 107. Also indicated is the direction of plasma fluid flow S, the directions of plasma currents J of adjacent plasma 102*a-c*, and magnetic fields $B^+$ due to plasma currents J. Further indicated in FIG. 2 are points a, b, and c of arc s1 of FIG. 3A, shown here for clarity.

Within the vacuum vessel 106 are electrodes 103 placed near, and held at a bias to, the vacuum vessel 106 which is generally grounded, with one electrode 103 generally being interior to one field coil 100 as shown in FIGS. 1 and 2. Similar to adjacent field coil 100 currents alternating along the device axis, electrodes 103 are energized to a bias voltage alternating along the device axis as illustrated by (+) and (−) in FIGS. 1 and 2 and are shaped such that the electric fields E (not shown) and electric field lines 104 are tangential to, or nearly tangential to, the magnetic fields B (not shown) and magnetic field lines 101. Accordingly an azimuthal E×B plasma fluid drift is generated in plasma 102 of a constant direction (see References below, Chen $2^{nd}$ Ed. Ch. 2) to result in a fluid rotation about the device axis where plasma 102 is the fluid. Plasma 102 drift, a fluid drift called alternately "E×B drift", "plasma drift" and etc., is induced in magnetized plasma in the direction of the vector cross product of the electric and magnetic field directions as is known to those with skill in the art. The magnetic fields and electric fields alternate in polarity along the device axis such that the azimuthal direction of plasma drift is constant in direction along the axial length of the device, the magnitude of which is approximately $v_d = E \times B/|B|^2$ in cgs units to first order where E and B have their usual meaning in electromagnetic vector notation.

It is an object of the present invention that azimuthal plasma 102 fluid drift (E×B drift) may satisfy the criterion $B_0^2/8\pi R| > nm_i g$ where R is the plasma major radius, n is plasma density, $m_i$ is the ionic species mass, and g is centripetal acceleration (see References below, Spalding) but sufficient to move plasma away from the cylindrical axis. In another embodiment of the velocity of fluid drift may be such as to violate this condition. In accordance with either embodiment the electric fields are held to a sufficient bias.

Referring now to FIG. 2, it is an object of the present invention that the direction of plasma fluid flow E×B and the direction of momentum transfer from the electric and magnetic fields to the fluid E×H (Poynting's Theorem; see References below, Jackson $2^{nd}$ Ed. Chs. 5 and 6) are consistent in direction S along the device axial length. In the example embodiment of FIG. 2 the direction is into the page (x).

Referring still to FIG. 2, in one example form of the present invention plasma 102 charged particles possess a current J into the page (x) generated by at least curved vacuum field drift of charged particles in a magnetic field and diamagnetic drift of charged particles in a magnetic field. In a curved vacuum field the total charged particle drift is approximately:

$$\overline{A}_{\overline{A}} + \overline{A}_{\nabla B} = \frac{\overline{A}}{\overline{A}}\left(\overline{A}_{\|}^{2} + \frac{1}{2}\overline{A}_{\perp}^{2}\right)\frac{\overline{A}_{\overline{A}} \times \overline{A}}{\overline{A}_{A}^{2}\overline{A}^{2}}$$

where $\overline{A}_{\overline{A}}$ and $\overline{A}_{\nabla B}$ are the plasma 102 charged particle drift velocities due to magnetic field curvature and gradient, respectively, $$\frac{\overline{A}}{\overline{A}}$$

is charged particle species mass divided by charge, $\overline{A}_{\|}^2$ is the square of the charged particle velocity along magnetic field lines 101, $\overline{A}_{\perp}^{2}$ is the square of the charged particle velocity transverse to magnetic field lines 101, $\overline{A}_{\overline{A}}$ is a vector (in the denominator a scalar) of magnetic field line 101 curvature from axis of curvature outward, and $\overline{A}$ is magnetic field (in the denominator B is a scalar). Diamagnetic drift is approximately:

$$\overline{A}_{\overline{A}} = -\frac{\nabla\overline{A}\times\overline{A}}{\overline{A}\,\overline{A}\,\overline{A}^{2}}$$

where $\nabla\overline{A}$ is gradient of plasma 102 pressure and $\overline{A}$ is plasma 102 density. In accordance with this embodiment the magnetic field coils 100 are held in sufficient axial proximity to establish sufficient magnetic field curvature and gradient to establish sufficient curved vacuum field drift current. Additionally in accordance with this embodiment centrifugal rotation of plasma 102 is established to a sufficient value to establish a sufficient plasma density gradient to establish a sufficient diamagnetic drift current. In the present invention curved vacuum field drift and diamagnetic drift add to generate currents J. Currents J, alternating in direction relative to adjacent currents J, generate magnetic fields $B^{+}$ with alternating magnetic field polarities as indicated. Along the axial length of the present invention J of adjacent plasmas 102 oppose in direction and accordingly $B^{+}$ of adjacent plasmas 102 oppose in direction. For instance, plasma 102*b* travels as a fluid in a direction into the page (S), possesses a current J into the page, and this current produces magnetic field $B^{+}$ of clockwise direction. Accordingly plasmas 102*a* and 102*c* travel as fluids into the page (S), possess currents J out of the page, and these currents produce magnetic fields $B^{+}$ of counterclockwise direction.

Referring still to FIG. 2 plasma 102 and electrodes 103 are enclosed in a vacuum vessel 106, formed of any suitable material. Surrounding the vacuum vessel 106 are magnetic field coils 100. Plasma 102 may travel along magnetic field lines 101 toward loss windows 107, formed of any suitable material, and either impinge on loss window 107, being therefore a wall of the vacuum vessel 106, or if open through the cusp (see FIG. 1) plasma 102 may travel into a region of electrostatic deceleration electrodes (not shown) or other means.

It is an object of the present invention that the current J, and accordingly $B^{+}$, created by the curved vacuum field and diamagnetic drifts in plasma 102 at position N along the device axis opposite in direction to the current J and magnetic field $B^{+}$ created in plasma at positions N+1 and N−1 (fore and aft along the axial length of the device). A common feature of cusp-geometry magnetic field plasma confinement is opposed plasma sheath currents in adjacent plasma segments generated by curved vacuum fields and diamagnetic drift (see References below, Chen $2^{nd}$ Ed., Chs. 2 and 3, Berkowitz 1958, and Spalding) and in order to generate diamagnetic drift a density gradient must be established in plasma. It is an object of the present invention that the magnetic field increases radially outward from the device axis toward a magnetic field coil 100 such that a plasma 102 density gradient can be established for the generation of a suitable diamagnetic drift current. In accordance with this particular form of the present invention, one consequence of the curved vacuum field and diamagnetic drift currents is the so-called "pinch" effect similar to the Ware pinch occurring in so-called "banana" orbits of tokamak reactors (see References below, Chen 2011). In another accordance with this particular form of the present invention a second feature of opposed adjacent curved vacuum field and diamagnetic drift currents J ($B^{+}$ hereafter is inferred) is enhanced plasma 102 confinement along magnetic field lines 101 due to adjacent plasmas 102 being repelled by Ampère force away from the cusp 105. In accordance with this particular form, it is therefore preferable that at least three plasmas 102 be confined adjacently in a device of at least 5 field coils 100, such that the benefit of additional confinement by repulsion of adjacent plasmas 102 away from the cusp 105 is gained.

Figure 3A:
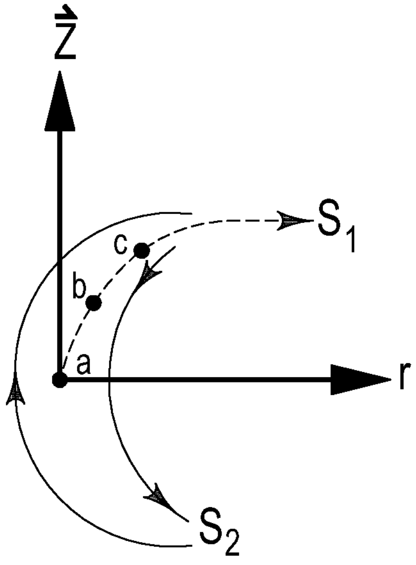
FIG. 3A is a diagram showing two contour lines interior to s1 and along the outboard and inboard radial boundaries s2 of confined plasma (not shown). Interior contour s1 traverses the interior of confined plasma sheath, originating along the equatorial plane interior to plasma, intersecting at representative points a, b, c, along arc s1 and extending to a first cusp region (not shown). Exterior contour s2 traverses the radially inboard surface of plasma from a first axial z and radial r cusp region (not shown) to a second cusp region (not shown) and returns along the radially outboard surface of confined plasma.

Referring now to FIG. 3A, curves s1 and s2 represent arcs interior to the plasma sheath (s1) and on the surface of the sheath (s2). Arc s1, interior of the plasma sheath, traverses a path from near the equatorial plane of plasma to a point near the cusp. Arc s2 traverses the boundary of a plasma sheath, from one cusp region to a second cusp region adjoining the same plasma, first along the radially inboard surface of plasma sheath then along the radially outboard surface of plasma sheath.

Figure 3B:
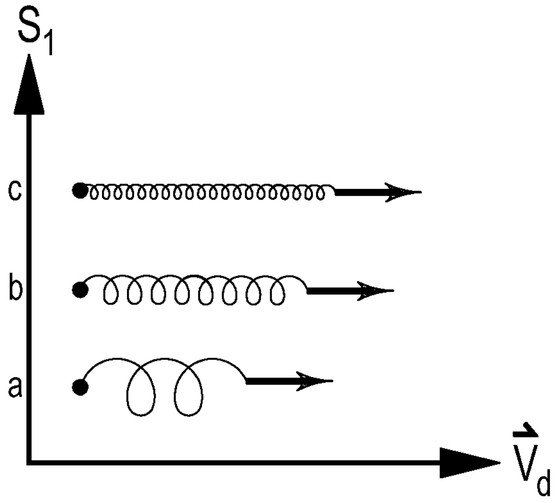
FIG. 3B is a dual graphical illustration not to scale of velocity shear and Larmor radius of individual charged particles. Along the ordinate axis is the contour s1 and points a, b, c, of FIG. 3A and along the abscissa direction is the plasma drift velocity $v_d$ where $v_d = E \times B/|B|^2$.

Referring now to FIG. 3B, in one form of the present invention a shear in fluid velocity may be present in plasma 102 (not shown for clarity but which may be deduced from the shape of the curves s1 and s2). According to this embodiment the plasma E×B drift velocity may be greater near the cusp region (not shown for clarity) than near the equatorial plane, where here E×B drift velocity is shown as the length of the arrow which at position c is greater than the length of the arrow at position a to indicate a shear in the drift velocity approaching the cusp. Shown also are relative sizes of plasma particle Larmor radii along s1 being the relative sizes of the helices at positions a, b, and c. It is an object of the present invention that the electrodes 103 (not shown) may be shaped to add or remove a velocity shear in the plasma by inducing an electric field across the magnetic field that may vary from equatorial plane to cusp in electric field direction and/or value relative to that of no velocity shear. In one embodiment of the present object the value of the electric field E divided by the value of the magnetic field B increases by an additional factor of the order 1/R, where R is the plasma major radius, along a magnetic field line 101 from the equatorial plane of a field coil 100 to a cusp 105, such that no E×B velocity shear is present along the contour s1, corresponding to a fluid rotation of constant angular frequency. In another embodiment of the present invention the value of the E×B drift tangential velocity along s1 may be constant toward the cusp 105 to produce a slight negative velocity shear. In another embodiment the electric field may be designated such that the fluid drift velocity increases or decreases along the same arc toward the cusp to any desired value of velocity shear (see References below, Hassam 1992, Huang and Hassam 2001). In another embodiment of the present invention velocity shear is adjustable. One such means of adjustment is by inducing a gap between the electrode and the vacuum vessel. This can be accomplished by actuating a device to move the electrode in the axial or radial directions, or by utilizing a plurality of individual electrodes in parallel along the axial and radial arc of the vacuum vessel in place of a single electrode, each electrode segment set to an individual bias.

In another form of the present invention plasma E×B drift may vary along the axial length of the device such that one plasma E×B drift velocity may be different in magnitude than that of an adjacent plasma.

Figure 3C:
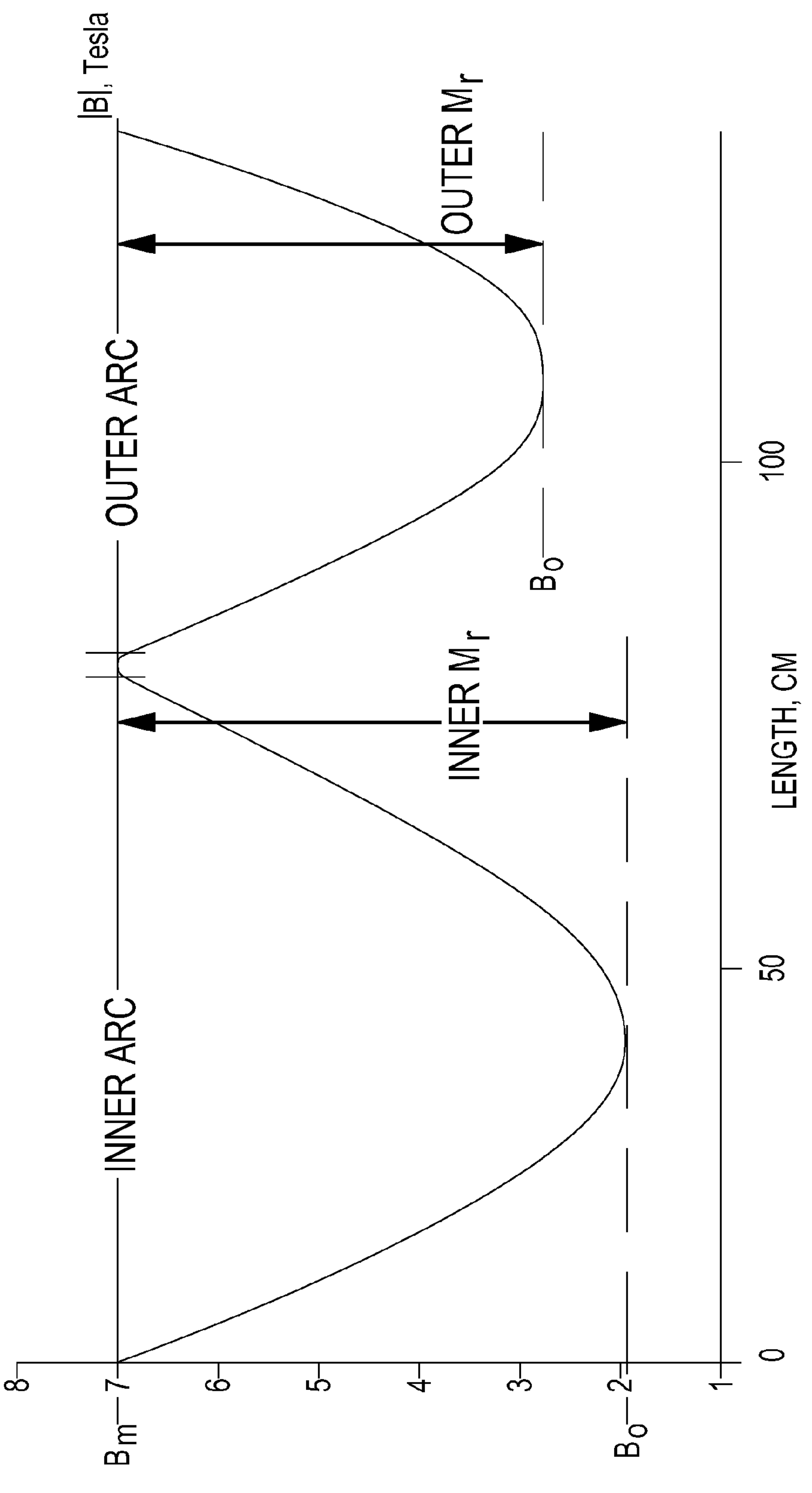
FIG. 3C is a graph showing calculations for magnetic mirror ratio Mr along arc s2 for one device configuration having magnetic field intensity B in units of Tesla on the ordinate axis, and length along contour s2 on the abscissa axis.

Referring now to FIG. 3C, it is an object of the present invention that the device magnetic mirror ratio Mr be above 2 for commercial viability. In most cusp reactors this mirror ratio is undefined but can be defined here for the present invention as the ratio of the magnitude of the vacuum magnetic field where plasma 102 (see FIG. 1) is reflected in the vicinity of the cusp 105 (see FIG. 1) to the magnitude of the vacuum magnetic field along an equatorial plane midway between cusps 105 at the point where the confining magnetic field has only an axial component and is at a minimum value. As shown in FIG. 3C in one form of the present invention a Mr of 2 is achieved along the radially outboard segment of arc s2 of plasma 102.

Figure 4:
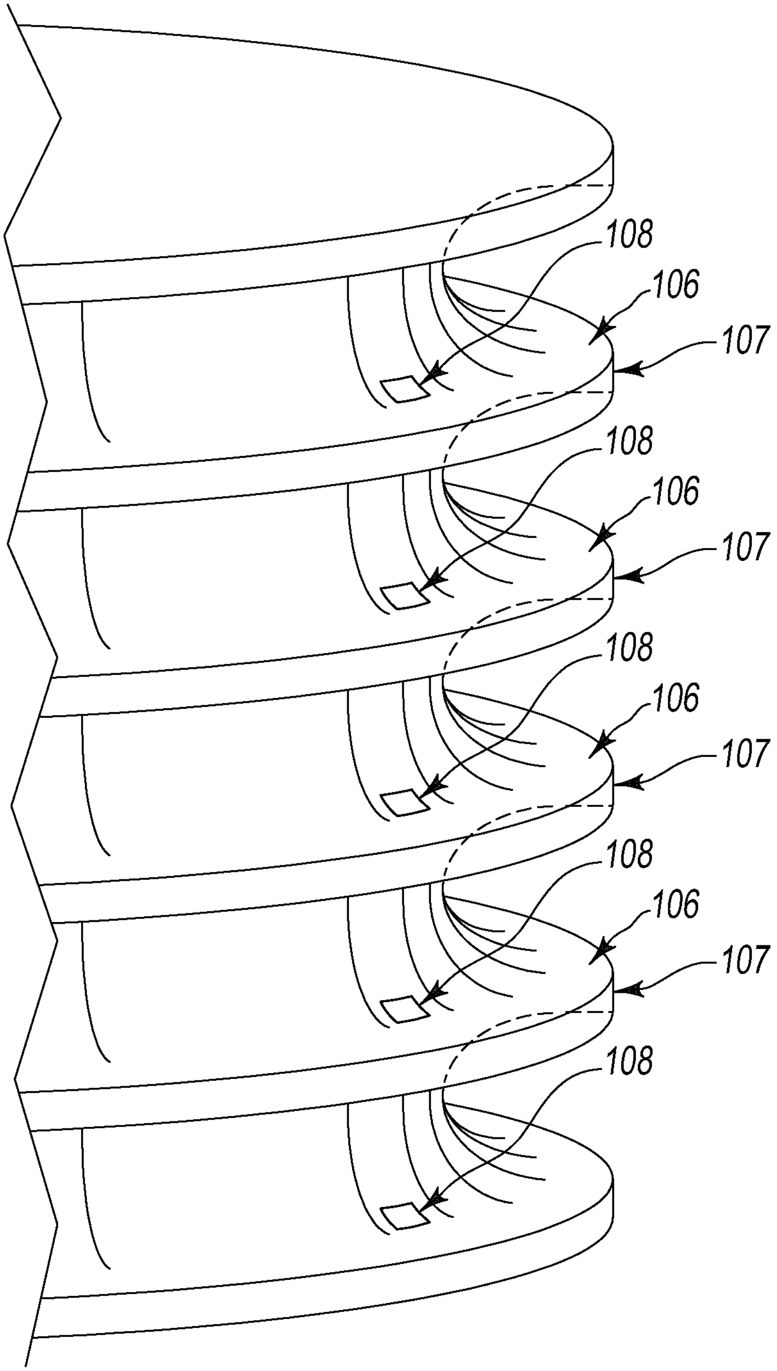
FIG. 4 shows an exterior view of a vacuum vessel 106 with the magnetic field coils removed to indicate locations of loss windows 107 and couplings 108 for electrical connection to interior electrodes 103 (not shown, but see e.g.

FIG. 4 shows an exterior view of vacuum vessel 106 with magnetic field coils removed to indicate locations of loss windows 107 and couplings 108 for electrical connection to interior electrodes 103 (not shown).

Figure 5:
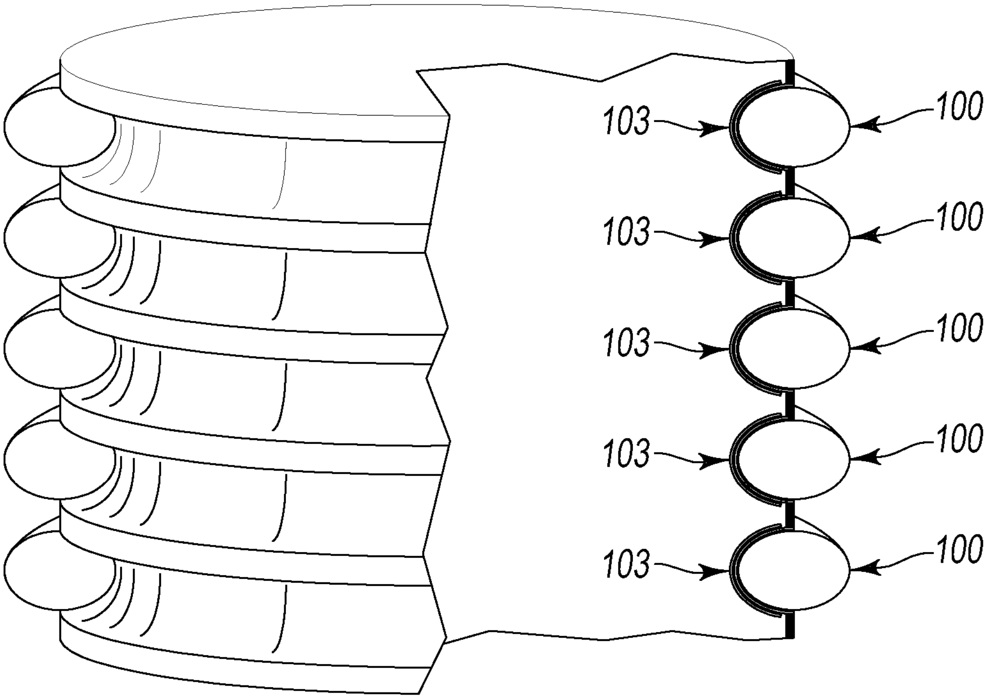
FIG. 5).

FIG. 5 shows an exterior view of vacuum vessel 106, placement of magnetic field coils 100 in relation to vacuum vessel 106 and a partial cutaway showing the interior of the vacuum vessel 106 to indicate relative location of electrodes 103.

Figure 6:
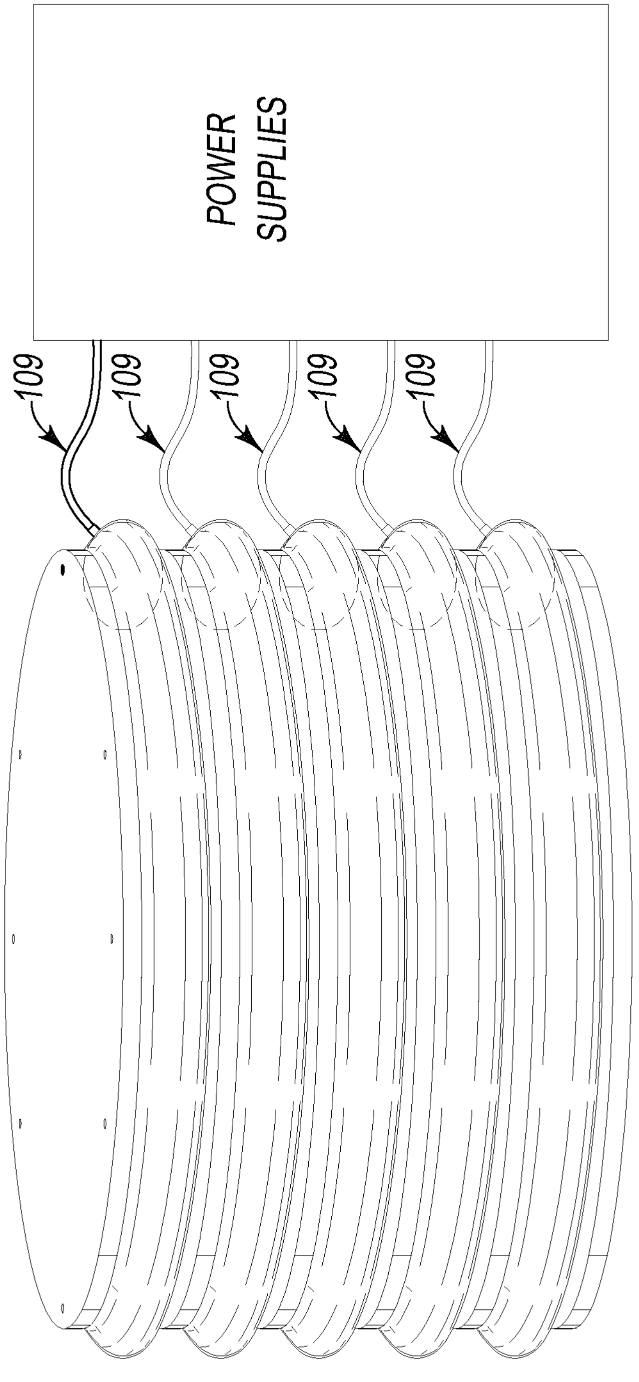
FIG. 6 shows the vacuum vessel 106, electrical connections 109 from field coils 100, to suitable power supplies for the supply of electrical energy to the field coils and electrodes (not shown, but see e.g.

FIG. 6 shows vacuum vessel 106, electrical connections 109 from field coils 100, to suitable power supplies for the supply of electrical energy to the field coils and electrodes (not shown). In one embodiment of the present invention the current supplied to the magnetic field coils may oscillate, with or without modulation, or be static. In another embodiment of the present invention the power supplied to the electrodes may oscillate, with or without modulation, or be static such that the electric field of the electrodes may oscillate with or without modulation or be static.

It is an object of the present invention that the magnetic field possess the following desirable features. In accordance with this embodiment convex magnetic confinement field line 101 curvature, as seen from the interior of plasma 102 radially outward, ensures plasma 102 stability by providing “good” curvature as is known to those with skill in the art. Additionally in accordance with this embodiment the placement of the field coils 100 in proximity provides for, the magnetic mirror effect of charged particle reflection at the cusp 105 with a magnetic mirror ratio Mr greater than 2 along certain magnetic field lines 101 and specifically those magnetic field lines 101 of the outboard side of confined plasma 102, adequate magnetic pressure for confinement of plasma 102 of sufficient density to be of commercial interest, and magnetic pressure increasing radially outward toward a magnetic field coil 100.

Referring back to FIG. 1, regions of increased magnetic field strength at the cusp 105 relative to magnetic field strength along the equatorial plane of the adjacent field coil 100, will reflect charged particles traveling along these magnetic field lines with a loss of mass m through a cusp loss window as is known to those with skill in the art. In one embodiment of the present invention loss of mass m may be a feature of the devise, for example for separation of charged particles, or in another embodiment ash collection, into a region of deceleration electrodes. It is one object of the present invention that confined plasma at equilibrium 102 (“confined plasma” or “plasma”) is established in the annular region between cusps 105 and due to centrifugal rotation is forced away from the axis and therefore away from the null region of no magnetic field near the axis of the reactor. In accordance with this object, plasma not confined within this equilibrium region is lost through the cusp 105 as is common to present-day cusp reactors. In accordance with this object of the present invention equilibrium may include an inflowing of plasma charged particles and an outflowing of charged particles through the cusp, for example, for charged particle separation, ash collection, and etc. and would thus constitute a desirable feature of the device.

In one example embodiment of the present invention, 25-cm by 50-cm elliptically-shaped magnetic field coils 100*a*, 100*b*, and 100*c* (in reference to FIG. 1) of 4 m major radius are wound with 12-gauge copper magnet wire to approx. 90% fill using hexagonal packing of approx. 106700 turns and carry 102 A current in field coil 100*b* and −108 A current (negative indicating the opposing direction) in the adjacent magnetic field coils 100*a* and 100*c*. The resulting magnetic field 10 cm interior to the inner wall of the center coil, along its equatorial plane, is approximately 1.85 Tesla and along that field line has a cusp/equatorial plane magnetic field ratio Mr of 3.3. An electric field of 10800 V/m at the equatorial plane induces azimuthal plasma rotation of approximately 5800 meters/second. Plasma 102 may thereby be generated to any of a range of temperatures and densities.

It is an object of the present invention to provide means for simple and robust construction of the device using conventional materials and improvements of operation. In accordance with this object the magnetic field coils may be of any cross-sectional shape, for example square in cross-section, ellipses with major axes in the radial direction and minor axes in the axial direction, or any shape.

Further in accordance with this object, one such construction method utilizes resistive current elements in the magnetic field coils 100, for example Bitter electromagnetic plates, and another such construction method utilizes non-resistive elements for example superconducting wire or plates. In one form of the present invention, magnetic field coils are constructed of conductive plates for example Bitter plates and derivatives thereof such as for example those of the Split Florida-Helix magnet of US Patent Application 2007/0210884 A1 to Bird, et al. In accordance with providing improvements of operation, in one embodiment a means for heat removal from the device through the magnetic field coils 100 is provided by channels for fluid flow within the field coils 100. Bitter plate electromagnets are ideally suited for this object while also providing strength against high Lorentz forces. It is understood that in the device description disclosed herein the term “electromagnetic field coils” and etc. may thereby be interchanged in accordance with the present embodiment to be “electromagnetic plates” and etc. The former, more common term, is used throughout.

In another embodiment of the present invention providing means for improved operation the plasma-device aspect ratio, as measured by the radius of the center of the annular plasma 102 along its equatorial plane divided by the height of plasma as measured between cusps 105 is greater than ~16 as discussed by Hassam and Huang, Physical Review Letters v. 91 n.19, 7 Nov. 2003, or any value as permitted by the technology for creating high magnetic fields. In accordance with present theory (see References below, Grad 1961) the device may have a radial dimension on the order of a few multiples of the ion cyclotron radius. It is an object of the present invention to provide means for improving the device aspect ratio to either above or below 16 and this may be accomplished by increasing the magnetic field and/or improvements in magnet (field coil 100) design and materials.

In one form of the present invention, the cusp 105 may be centered or offset axially from the physical center between adjacent magnetic field coils 100. The gap between magnetic field coils 100 provides the physical channel through which charged particles may exit the confinement region toward electrostatic deceleration electrodes to provide a means for ash collection or ion separation and is sized according to the dictates of confinement field shape, particle loss from the confinement region, particle collection, physical construction requirements, and etc.

In yet another form of the present invention, providing means for improved operation the electrodes 103 may by segmented as is common in magnetohydrodynamic power systems to compensate for the Hall effect (see References below, Nasar 1970 and Sutton & Sherman 1965).

Generation and heating of plasma 102 are by any means known to those with skill in the art, including microwave generation and heating, ion cyclotron resonance generation and heating, capacitive-coupled generation and heating, neutral beam injection, shock injection and heating, and etc. In one embodiment of the present invention, plasma 102 is created and heated preferably transverse to the magnetic field. In accordance with this embodiment transverse plasma 102 heating can be accomplished by induction coils (not shown), interior to the magnetic field coils, operating with radiofrequency opposed currents.

It is an object of the present invention to provide a means for increasing plasma 102 density. According to this object plasma 102 density may be increased by increasing the electric field strength to increase E×B rotational velocity accompanied by any necessary increase in magnetic field coil 100 current to balance the increased centrifugal force. In accordance again with this object of the present invention to provide a means of increasing plasma density a means of accomplishing this is by movement of a distal plasma 102 to a proximal target plasma 102 confinement region. In accordance with this embodiment of the present invention plasma 102 is translated along the axis of the device by creating an axial asymmetry in magnetic field strengths along the axis. For instance plasma 102 is moved from one confinement region to an adjacent confinement region, or beyond, by increasing the magnetic field strength of the aft magnetic field coil 100 or coils, or by decreasing the magnetic field strength of the fore magnetic field coil 100 or coils, or both, thereby moving plasma along the device axis.

An object of the present invention is direct transfer of electromagnetic field energy to plasma. In accordance with this object is a simple means for understanding momentum transfer between electromagnetic fields and plasma. All mechanical means of generating energy involve a rotating part (see References below, Nasar 1970). In the present invention, rotational momentum is transferred between electromagnetic fields and ponderable media (of which plasma is an example) along the Poynting vector given by E×H in the azimuthal direction. This direction is appropriately both the direction of momentum transfer and of E×B plasma fluid flow. While some dispute exists as to the correct form of Poynting's vector equation for electromagnetic energy transfer the direction is consistent where H here has been introduced to account for the tensor quality of the magnetic permeability μ of plasma (see References below, Jackson $2^{nd}$ ed. Ch. 5 and Ch. 6).

Although the drawings represent forms of the various features and components according to the present invention, the drawings are not necessarily to scale and certain features may be enhanced in order to better illustrate and explain the present invention. The drawings set out herein thus illustrate forms of the invention, and such forms are not to be construed as limiting the scope of the invention in any manner.

While the invention has been illustrated and described in detail in the foregoing drawings and description, the same is to be considered as illustrative and not restrictive in character, it being understood that only a illustrative forms thereof have been shown and described and that all changes and modifications that are within the scope of the following claims are desired to be protected.

REFERENCES

The following references and their references are hereby specifically incorporated herein by this reference.

General Plasma Physics:

Bishop, Amana S., "Project Sherwood: The U.S. Program in Controlled Fusion", Prepared for the United States Atomic Energy Commission, Addison-Wesley Pub. Co. Inc. Reading, Mass., U.S.A. (1958).

Chen, Francis F., Introduction to Plasma Physics and Controlled Fusion. Volume 1, Plasma Physics. Springer; $1^{st}$ edition (1974).

Chen, Francis F., Introduction to Plasma Physics and Controlled Fusion. Volume 1, Plasma Physics. Springer; $2^{nd}$ edition (May 31, 2006). ISBN-13: 978-0306413322

Chen, Francis F., An Indispensable Truth: How Fusion Power Can Save the Planet, Springer (2011).

Cambel, Ali Bulent, "Plasma Physics and Magnetofluid-Mechanics" McGraw-Hill (1963).

Jackson, J. D., "Classical Electrodynamics" $2^{nd}$ Ed., John Wiley & Sons, Inc. (1975)

Specific Examples

Bateman, Glenn. "MHD Instabilities". MIT Press, 1978.

Park, J., et. al., "High Energy Electron Confinement in a Magnetic Cusp Configuration", arXiv preprint, arXiv: 1406.0133v1, 1 Jun. 2014.

Hershkowitz, N., Dawson, J. M., "Fusion Reactor with Picket-Fence Walls", *Nuclear Fusion*, vol. 16, no. 6, pg. 639-, 1976.

Oscar Anderson, William R. Baker, Alexander Bratenahl, Harold P. Furth, and Wulf B. Kunkel, "Hydromagnetic Capacitor", *Journal of Applied Physics* 30, 188 (1959)

T. K. Allen and I. J. Spalding, "Cusp Compression Experiments", *Physics of Fluids*, Vol 8, p. 2032, (1965)

R. E. Pechacek, J. R. Greig, M. Raleigh, D. W. Koopman, and A. W. DeSilva, "Measurement of the Plasma Width in a Ring Cusp", *Physical Review Letters*, Vol. 45, Issue 4, 256 (1980)-28 Jul. 1980

George H. Miley, "Fusion Energy Conversion", American Nuclear Society, Illinois, 1976

S. A. Nasar, "Electromagnetic Energy Conversion Devices and Systems", Prentice-Hall, Inc., Englewood Cliffs, N.J., (1970)

George W. Sutton & Arthur Sherman, "Engineering Magnetohydrodynamics", McGraw-Hill, 1965

Cusped Geometry Confinement Theory:

J. Berkowitz, K. O. Friedrichs, H. Goertzel, H. Grad, J. Killeen and E. Rubin, "Cusped Geometries", in *Proceedings of the Second International Conference on the Peaceful Uses of Atomic Energy*, Geneva, 1958, vol. 31, p. 171.

James L. Tuck, "Plasma Jet Piercing of Magnetic Fields and Entropy Trapping into a Conservative System", *Physical Review Letters*, vol. 3, no. 7, p. 313-315, 1959.

Harold Grad, "Plasma Trapping in Cusped Geometries", *Physical Review Letters*, vol. 4, n. 5, Mar. 1, 1960.

Harold Grad, "Theory of Cusped Geometries: I. General Survey", AEC Research and Development Report, NYO-7969, Dec. 1, 1957.

Jerome Berowitz, "Theory of Cusped Geometries: II. Particle Losses", AEC Research and Development Report, NYO-2536, Jan. 6, 1959.

John Killeen, "Theory of Cusped Geometries: IV. Particle Losses in Crossed Fields", AEC Research and Development Report, NYO-9370, Nov. 15, 1960.

Grad, H., "Containment in Cusped Plasma Systems", AEC Research and Development Report, NYO-9496, Mar. 30, 1961.

Haines, M. G., "Plasma Containment in Cusp-Shaped Magnetic Fields", *Nuclear Fusion*, Vol. 17, n. 4, 1977.

Ian Spalding, "Cusp Containment", in Advances in Plasma Physics, Vol. 4, p. 79-123. A. Simon and W. B. Thompson, Eds, Wiley Interscience, 1971.

Flow Shear:

A. B. Hassam, *Physics of Fluids B* vol. 4, no. 3, p. 485, March 1992

Yi-Min Huang and A. B. Hassam, *Physical Review Letters*, vol. 87, no. 23, 3 Dec. 2001

What is claimed is:

1. A device for the magnetic confinement of plasma, comprising:

a plurality of circular, electric current carrying, magnetic field coils, each magnetic field coil placed along a shared cylindrical axis in close proximity to axially adjacent magnetic field coils and having a direction of electric current opposite in direction to its axially adjacent magnetic field coil such as to create a cusped magnetic field between axially adjacent magnetic field coils having convex field line curvature as viewed radially outward from the shared cylindrical axis;

a vacuum vessel surrounded by and enclosing a space radially interior of the magnetic field coils; and a plurality of electrodes situated inside the vacuum vessel and proximal to an inner radial wall of the vacuum vessel, each electrode disposed annularly along the inner radial wall of the vacuum vessel such that each electrode is at an axial position interior to each magnetic field coil and having an electric charge opposite in voltage polarity to its axially adjacent electrode such as to create an electric field between axially adjacent electrodes perpendicular to the magnetic fields.

2. The device of claim 1, wherein the vacuum vessel is cylindrical in shape with an axial wall shaped to accommodate the plurality of magnetic field coils such that the magnetic field coils are in close axial proximity and to accommodate the plurality of electrodes that produce electric fields perpendicular to the magnetic fields.

3. The device of claim 1, wherein the vacuum vessel is composed of a material suitable for confinement of plasma.

4. The device of claim 1, wherein the vacuum vessel is closed in a region axially between the magnetic field coils.

5. The device of claim 4, wherein the vacuum vessel is open to charged particle transfer in a region axially between the magnetic field coils.

6. The device of claim 5, wherein a second region includes electrostatic deceleration electrodes, the second region for collection of particle species having traveled along magnetic field lines through the cusped magnetic fields between the magnetic field coils.

7. The device of claim 1, wherein the vacuum vessel is closed in a region of the cusped magnetic fields, and further comprising an annulus adjoining the vacuum vessel in the axial direction.

8. The device of claim 7, wherein the annulus is composed of a material suitable for impingement of charged particles.

9. The device of claim 8, wherein the annulus is composed of one or both of quartz or ceramic.

10. The device of claim 1, wherein the plurality of electrodes is equal in number to the plurality of magnetic field coils.

11. The device of claim 1, wherein each magnetic field coil is energized with electric current being set at one of a constant value, a constant value plus a low-frequency oscillation, or a general oscillation.

12. The device of claim 1, wherein each magnetic field coil is composed of one of any number of turns of conductive wire or any number of plates of conductive material.

13. The device of claim 12, wherein the wire or plates are either resistive or non-resistive.

14. The device of claim 1, wherein the magnetic field coils are positioned in proximity to axially adjacent magnetic field coils to induce reflection of charged particles traveling along magnetic field lines toward the cusped magnetic fields, and further in proximity to establish curved vacuum field drift of charged particles traveling along the magnetic field lines of the cusped magnetic fields.

15. The device of claim 1, wherein the plurality of electrodes are energized with electric charge in, a bias plus oscillation or a general oscillation, the electrodes oscillating at radio frequencies such as to generate or heat plasma.

16. The device of claim 1, wherein each one of the plurality of electrodes is shaped along a radial and axial direction to produce electric fields generally perpendicular to the cusped magnetic fields and so as to produce any amount of shear in plasma fluid flow velocity.

17. The device of claim 1, wherein the electrodes are aximuthally segmented for minimizing Hall current.

18. The device of claim 1, wherein the electrodes are energized with electric potential such as to produce any desired amount of azimuthal plasma flow as a fluid about the shared cylindrical axis.

19. The device of claim 18, wherein the velocity of plasma fluid flow and the cusped magnetic fields have transverse pressure gradient, such that a gradient in plasma density is established for the generation of a polarization drift current in plasma.

20. The device of claim 18, wherein the velocity of plasma fluid flow varies along the shared cylindrical axis.

21. The device of claim 18, wherein the plasmas are being moved along the axial length of the device by adjustment in the currents of the field coils radially or axially adjacent to plasma.

* * * * *